(12) United States Patent  (10) Patent No.: US 8,648,341 B2
Yang et al.  (45) Date of Patent: Feb. 11, 2014

(54) METHODS AND APPARATUS FOR TESTING PADS ON WAFERS

(75) Inventors: Chung-Yuan Yang, Kaohsiung (TW); Jen-Pan Wang, Tainan (TW); Jiun-Jie Huang, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 31 days.

(21) Appl. No.: 13/403,880

(22) Filed: Feb. 23, 2012

(65) Prior Publication Data

US 2013/0221353 A1 Aug. 29, 2013

(51) Int. Cl.
*H01L 23/58* (2006.01)
(52) U.S. Cl.
USPC .............. 257/48; 257/723; 257/737; 257/738
(58) Field of Classification Search
USPC ...................... 257/48, 723, 737, 738, E23.179
See application file for complete search history.

(56) References Cited

U.S. PATENT DOCUMENTS

| 6,362,491 | B1* | 3/2002 | Wang et al. ................... 250/548 |
| 6,628,001 | B1* | 9/2003 | Chittipeddi et al. .......... 257/797 |
| 8,026,565 | B2* | 9/2011 | Harting et al. ................ 257/462 |
| 8,179,155 | B2* | 5/2012 | Tseng ...................... 324/762.01 |
| 8,368,180 | B2* | 2/2013 | Yu et al. ........................ 257/620 |
| 2008/0073753 | A1* | 3/2008 | Tsai et al. ...................... 257/620 |
| 2008/0128690 | A1* | 6/2008 | Burnside et al. ............... 257/48 |
| 2010/0001268 | A1* | 1/2010 | Frye et al. ...................... 257/48 |

* cited by examiner

*Primary Examiner* — Theresa T Doan
(74) *Attorney, Agent, or Firm* — Slater & Matsil, L.L.P.

(57) ABSTRACT

Methods and apparatuses for sharing test pads among function blocks under test within multiple layers of a die are disclosed. A semiconductor wafer comprises a first die and a second die separated by a scribe line. A first pad, a second pad, and a third pad are located in the scribe line. The test pads may be located within a die as well. The first pad and the second pad are used to test a first function block within a first layer, and the first pad and the third pad are used to test a second function block within a second layer of the first die. The shared first test pad are used to test multiple function blocks contained in different layers of the die. Therefore fewer test pads are needed which leads to reduced area for scribe lines in a wafer.

20 Claims, 3 Drawing Sheets

METHODS AND APPARATUS FOR TESTING PADS ON WAFERS

BACKGROUND

Wafers are used as carriers for fabrication during the production of integrated circuits (IC). After semiconductor fabrication processes, a plurality of dies is formed on a wafer. These dies are later separated through a die cutting or singulation process in which typically a mechanical or laser saw is used to cut through the wafer between individual chips or dies. To facilitate the die cutting process, relatively narrow sacrificial scribe lines are provided on the wafer along which the cuts are made to separate the dies. A scribe line area comprises the areas of wafer that are not utilized or occupied by the dies. After fabrication, the integrated circuit devices (or IC dies) are typically tested at the wafer level before singulation.

To facilitate wafer level testing before the die cutting process, conductive paths of multi-layer interconnect structures formed within the dies are typically terminated in conductive bond or test pads disposed at the wafer, which may be called the "Process Control Monitor" (PCM) test pads. The PCM test pads allow various electrical tests to be performed to monitor the complex semiconductor fabrication process and check the reliability of the dies before singulation. A plurality of test pads is typically distributed throughout the surface of the wafer in the scribe line areas. Some test pads may be placed on the chip area of a die as well.

With the ever increasing degree of integration, more functions are integrated into a die fabricated with multiple layers, more test pads may be needed for overall process monitor, which results in more area for test pads in the scribe line area and therefore less area for chip die in the wafer. Methods for reducing the testing pads needed are of interest for reducing the test pad area so that more wafer area can be used for dies.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the embodiments of the present disclosure provide many applicable concepts that can be embodied in a wide variety of specific contexts. The specific embodiments discussed are merely illustrative of specific ways to make and use the disclosure, and do not limit the scope of the disclosure.

As will be illustrated in the following, methods and apparatus for sharing test pads among function blocks under test within multiple layers of a die are disclosed. The shared test pads can be used to test multiple function blocks contained in different layers of the die. Therefore fewer test pads are needed which leads to reduced scribe line areas in a wafer and more wafer area for dies.

Figure 1:
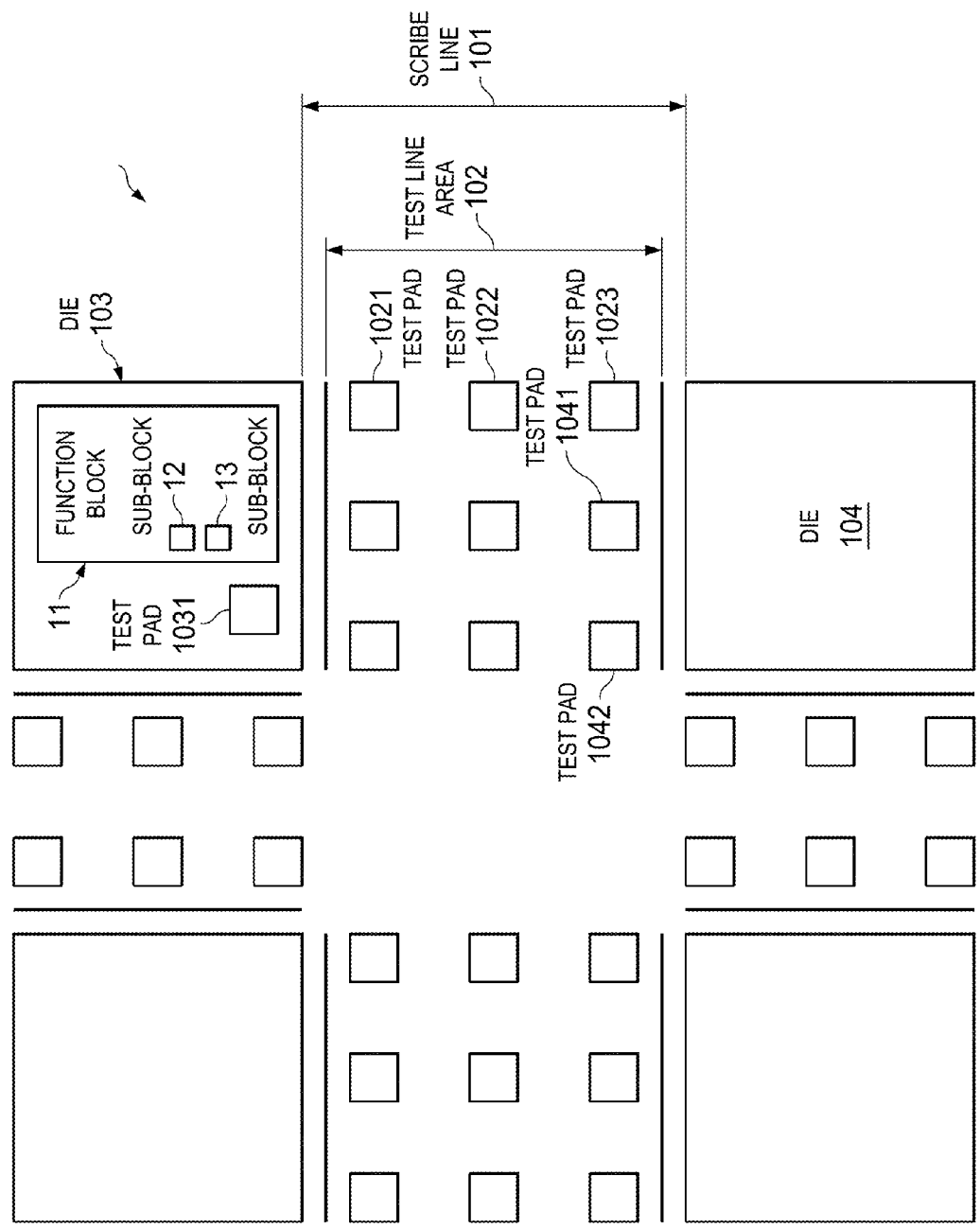
FIG. 1 illustrate a part of a wafer with scribe lines, test pads, function blocks under test, and die.

FIG. 1 illustrates a part of a wafer with scribe lines, test pads, function blocks under test, and die. A part of the wafer 10 shown in FIG. 1 comprises a plurality of die 103 and 104 on the wafer 10, separated by a scribe line 101. A plurality of testing pads such as 1021, 1022, 1023, 1041, and 1042 form a test line area 102 within the scribe line 101. The die 103 may also comprise a plurality of test pads such as the pad 1031. The pad 1031 in the chip area may be electrically connected to a testing pad such as the pad 1021 in the scribe line area. A plurality of function blocks under test may be contained in the die 103 for testing, for example, the block 11 may be such a function block under test. A function block may be used to refer to a function block under test in this disclosure. The die 103 may comprise multiple layers of structures. The function block 11 may comprise an inductor, a resistor, a capacitor, an active device, or a combination of those which may form a plurality of sub-blocks such as the function sub-block 12 and 13, where the sub-block may in turn be an inductor, a resistor, a capacitor, or an active device, a combination of those. The sub-blocks 12 and 13 may be connected in series or in parallel.

One of the purposes of a scribe line 101 may be for separating the dies. Wafer sawing may be performed on the wafer along the scribe line 101 to separate the die 103 from the die 104 on the wafer. The number of the die 103 and 104 are for examples only and are not limiting. There may be other number of die formed in the wafer 10.

The pads 1021, 1022, 1023 may be arranged in a row. The pad 1021 may be an aluminum pad, a copper pad, or other metal pad. Other pads may be made of the same or similar materials for the pad 1021. The pads 1021, 1022, 1023 may be used as the "Process Control Monitor" (PCM) test pads. The PCM test pads allow various electrical tests to be performed to monitor the complex semiconductor fabrication process and check the reliability of the dies before singulation. There may be other number of pads in the scribe line for other functions.

The test pad 1021 and 1022 may be used to test the function block 11 on the die 103. The pads 1041 and 1042 may be used to test a function block (not shown) within the die 104. Moreover, test pads may be shared among function blocks under test. For example, the pad 1021 and the pad 1022 may be used to test the function block 11 within the die 103, and the pad 1021 and the pad 1023 may be used to test another function block, not shown, within the die 103. When the pad 1021 and the pad 1022 are used to test the function block 11, there may be a conductive path used for such a testing, not shown, between the pad 1021 and the pad 1022 connecting the function block 11. The test pad 1031 located in the die instead of the scribe line area may also be used to test the function block 11. There may be a plurality of test pads located in the die to test the function blocks within the die.

Figure 2:
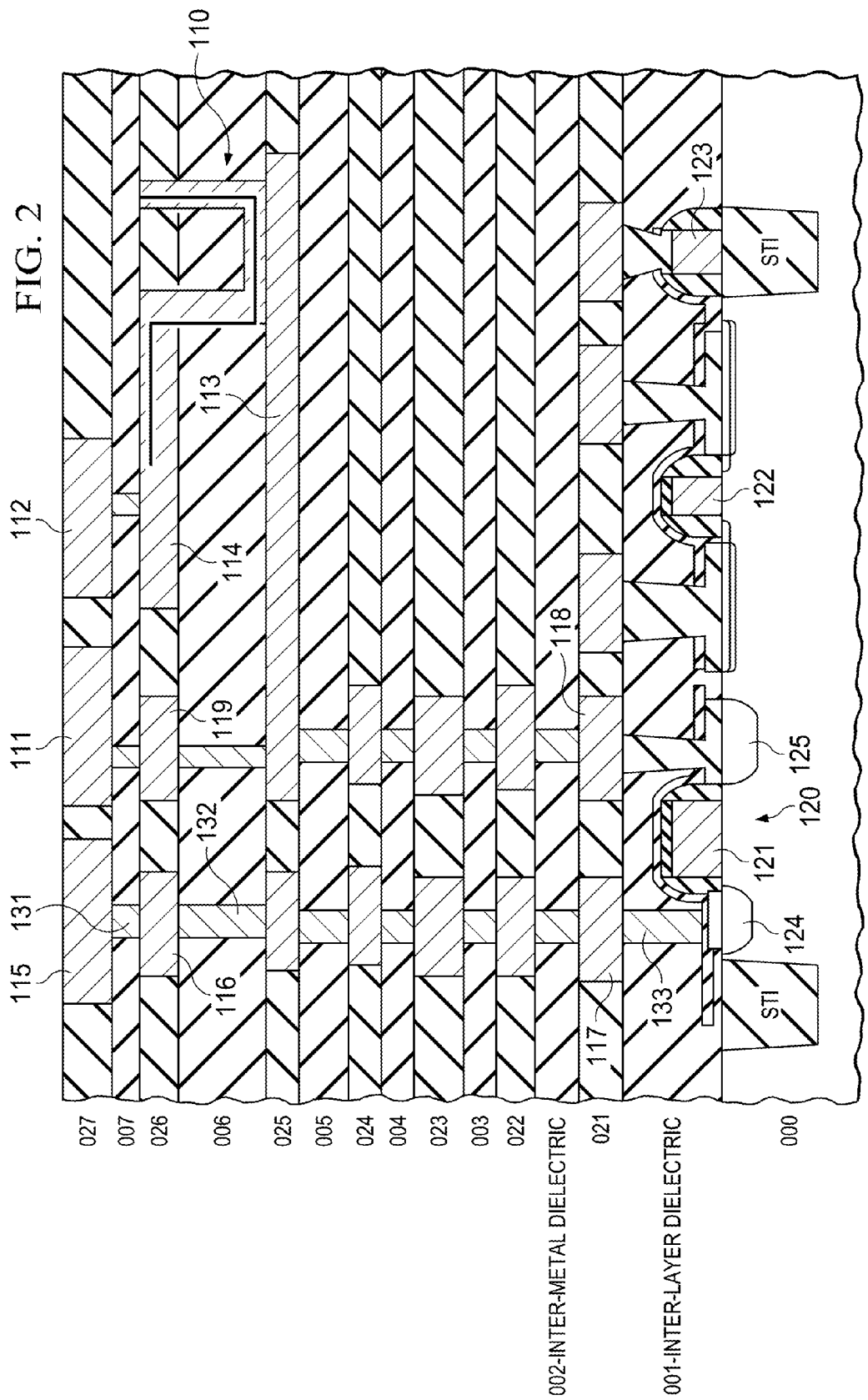
FIG. 2 illustrates a plurality of test pads connected to a plurality of function blocks within a multiple layer die.

FIG. 2 illustrates a plurality of test pads connected to function blocks within a multiple layer die. The test pads 111, 112, and 115 may be interconnected with function blocks such as an active device 120 or a capacitor 110 contained within multiple metal layers or the active layer. The test pads 111, 112, and 115 may be identical in configuration or may have different configurations, such as shapes or sizes. The test pads 111, 112, and 115 may be aluminum pads, copper pads, or other metal pads. The number of test pads and the number of layers shown in FIG. 2 are only for illustration purposes and are not limiting. There may be more test pads on the die, testing function blocks within different number of layers.

Test pads 111, 112, and 115 may be disposed within the scribe line on the semiconductor wafer as illustrated in FIG. 1. Test pads 111, 112, and 115 may also be disposed within the die. The active device 120 may be a transistor comprising a source 124, a drain 125, and a gate 121. The capacitor 110 may comprise a first electrode 114 and a second electrode 113. The first electrode 114 is connected to the test pad 112 through a via, while the second electrode 113 is connected to the test pad 111 through via and other internal pad or contact 119. Similarly, the drain 125 is connected to the test pad 111 through some internal pads or contacts such as 119 and 118 going through a plurality of via through the multiple layers of the die. The source 124 may be connected to the test pad 115 through other internal pads such as 116 and 117 connected by a plurality of via such as 131, 132, and 133.

The die may comprise multiple layers such as the active layer 000 or other metal layers 021-027. The bottom layer 000 of FIG. 2 is the substrate layer where a plurality of drain and sources regions of transistors are formed. On top of the layer 000 is a layer 001 which is the first inter-layer dielectric (ILD) between a first metal layer 021 and the bottom layer 000. On top of the layer 001 ILD is a first metal layer 021, where a plurality of metal contacts are located and connected to the devices within the bottom layer by via through the ILD layer 001. A second metal layer 022 is located on top of the first metal layer 021 separated by an inter-metal dielectric (IMD) layer 002. Similarly, additional metal layers 023, 024, 025, 026, and 027 are formed on top of each other and separated by IMD layers 002, 003, 004, 005, 006, and 007 respectively. The number of metal layers 021 to 027 is only for illustrative purposes and are not limiting. There could be other number of layers that is more or less than the 7 metal layers shown in FIG. 2. There may be other layers of the die not shown in FIG. 2, such as a metal protective capping layer and passivation layers.

The test pad 111 and 112 are used to test a function block 110, which is a capacitor, located within the metal layer 026 and the metal layer 025. The test pad 111 and 115 are used to test a function block 120, which is a transistor, located in the active layer 000. There is a conductive path used for such a testing, between the pad 111 and the pad 115, going through the internal pads 116, 117, 118, and 119, in addition to the connecting via. A similar conductive path exists between the test pad 111 and test pad 112 to test the function block 110 going through the internal pads 119 113, and 114 by way of via. The testing of the function block 110 and the testing of the function block 120 share a test pad 111. Therefore three pads 111, 112, and 115 can be used to test two function blocks 110 and 120. Without such a shared test pad 111, there would need at least four test pads to test two function blocks since two test pads are needed for each function block under test. By sharing test pads, the total number of test pads needed to test function blocks can be reduced.

The showing of the transistor 120 and the capacitor 110 is merely for examples only and is not limiting. There may be other function blocks being tested with different layers. The function block may comprise sub-blocks connected to each other in series or in parallel, where a sub-block may comprise an inductor, a resistance, a capacitor, a transistor or an active device. The layer 000 containing the function block 120 and the layer 026 containing the function block 110 are merely for example purposes only and are not limiting. There may be other function blocks contained in other layers of FIG. 2.

Figure 3:
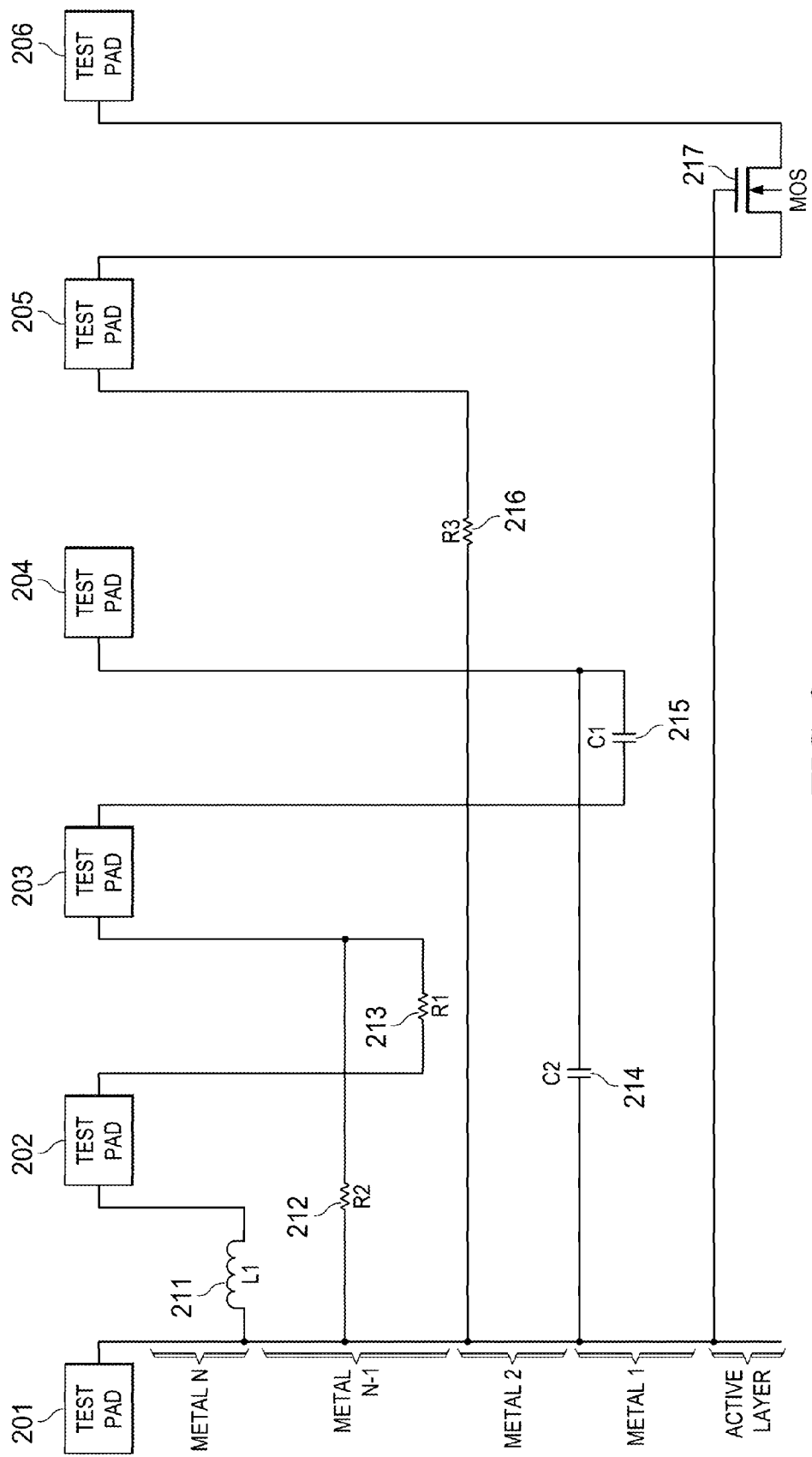
FIG. 3 illustrates a plurality of tests pads connected to a plurality of function blocks within a multiple layer die.

FIG. 3 illustrates a plurality of tests pads connected to a plurality of function blocks within a multiple layer die. A plurality of test pads 201, 202, 203, 204, 205, and 206 are connected to a plurality of function blocks 211, 212, 213, 214, 215, 216, and 217 respectively, as shown in FIG. 3. There are total 6 test pads, while there are total 7 function blocks. A test pad may be used to test multiple function blocks. Therefore the total number of test pads is reduced compared to the number of test pads needed without sharing.

The test pads 201, 202, 203, 204, 205, and 206 may be identical in configuration or may have different configurations, such as shapes or sizes. The test pads 201, 202, 203, 204, 205, and 206 may be aluminum pads, copper pads, or other metal pads. Test pads 201, 202, 203, 204, 205, and 206 may be disposed within the scribe line on the semiconductor wafer as illustrated in FIG. 1. Test pads 201, 202, 203, 204, 205, and 206 may also be disposed within the die.

The function block 211 may be an inductor located in a metal layer n, which is the top metal layer of the die. The function block 212, 213, and 216 may be resistors, located in metal layers n−1, n−1, and 2 respectively. There may be two function blocks 212 and 213 located in the same meal layer n−1. The function blocks 214 and 215 are capacitors, located in the same metal layer 1. Finally the function block 217 may be a transistor which is an active device located in the active layer of the die.

The number of pads, the number of function blocks, the number of layers of the die, the location of the function blocks within the layers, are all for illustration purposes only and are not limiting. There may be other number of test pads, function blocks, and layers in a die. The electronic connections between test pads and function blocks are shown in schematic ways without details of the connections.

The test pad 201 and the test pad 202 may be used to test the function block 211, which is an inductor. The test pad 202 and the test pad 203 may be used to test the function block 213, which is a resistor.

The test pad 201 and the test pad 203 may be used to test the function block 212, which is a resistor, following a first path going through the path test pad 201, the function bock 212, and test pad 203. At the meantime, there is a second path connecting the test pad 201 and the test pad 203, going through the test pad 201, the resistor 211, the test pad 202, the function block 213, and then the test pad 203. The two paths are connected in parallel and both are tested when a test is conducted between the test pad 201 and the test pad 203. The two function blocks 211 and 213 located in two different layers are connected in series and may be viewed as one new function block comprising the block 211 and 213 as its sub-block. The classification of function blocks and sub-blocks are based on the structure and connections of the test pads. For example, the function block 211 is a block when tested using the test pad 201 and the test pad 202. The function block 211 becomes a sub-block within a new function block comprising blocks 211 and 213 when tested using the test pad 201 and the test pad 203.

The test pad 203 and the test pad 204 may be used to test the function block 215, which is a capacitor. The test pad 201 and the test pad 205 may be used to test the function block 216, which is a resistor. The test pad 205 and the test pad 206 may be used to test the function block 217, which is a transistor located in the active layer.

The function block 214 is at metal layer 1 and is in a path from test pad 201 to the test pad 204. Therefore the test pad 201 and the test pad 204 may be used to test the function block 214. At the meantime, the test pad 201 and the test pad 204 may also test other function blocks connected in paths from the test pad 201 and the test pad 204. For example, the test pad 201 and the test pad 204 may also test the function block 215 connected in series to a new function block comprising the function blocks 211, 212, and 213, wherein the function block 211 and 213 are connected in series and the new function block comprises two parallel function blocks 212, and the blocks of 211 and 213 connected in series.

The connections among the test pads, the function blocks are merely for illustration purposes and are not limiting. There may be various other connections possible based on the functionalities of the die and the design of the die.

The description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A semiconductor wafer comprising:
   a first die and a second die separated by a scribe line on a wafer; and
   a first pad, a second pad, and a third pad located in the scribe line;
   wherein the first pad and the second pad are used to test a first function block within a first layer, and the first pad and the third pad are used to test a second function block within a second layer of the first die.

2. The wafer of claim 1, further comprising a conductive path between the first pad and the second pad connecting the first function block within the first layer, wherein the conductive path is used for testing the first function block.

3. The wafer of claim 1, wherein the first function block comprises an inductor, a resistor, or a capacitor.

4. The wafer of claim 1, wherein the first function block comprises a transistor or an active device.

5. The wafer of claim 1, wherein the first layer is a metal layer or an active layer.

6. The wafer of claim 1, wherein the first pad is an aluminum pad, a copper pad, or other metal pad.

7. The wafer of claim 1, wherein the first function block within the first layer comprises a sub-block connected to another sub-block in series or in parallel.

8. The wafer of claim 7, wherein the sub-block of the first function block comprises an inductor, a resistance, a capacitor, or a transistor.

9. The wafer of claim 1, wherein the second pad and the third pad are used to test a third function block within a third layer of the first die, and the first pad and the third pad are used to test the second function block in parallel connected to a sub-block, wherein the sub-block comprises the first function block serially connected to the third function block.

10. The wafer of claim 9, wherein the third layer is a same layer as the second layer.

11. The wafer of claim 1, further comprising a fourth pad located in the scribe line, wherein the first pad and the fourth pad are used to test a fourth function block within a fourth layer of the first die.

12. The wafer of claim 1, further comprising a fifth pad and a sixth pad located in the scribe line, wherein the fifth pad and the sixth pad are used to test a function block within a layer of the second die.

13. The wafer of claim 1, wherein the first pad, the second pad, and the third pad are arranged in a row.

14. A wafer, comprising:
   a first die;
   a first pad, a second pad, and a third pad located in a circuit area of the first die;
   wherein the first pad and the second pad are used to test a first function block within a first layer, and the first pad and the third pad are used to test a second function block within a second layer of the first die.

15. The wafer of claim 14, further comprising a conductive path between the first pad and the second pad connecting the first function block within the first layer, wherein the conductive path is used for testing the first function block.

16. The wafer of claim 14, wherein the first function block comprises an inductor, a resistor, a capacitor, or an active device.

17. The wafer of claim 14, wherein the first layer is a metal layer or an active layer.

18. The wafer of claim 14, wherein the first pad is an aluminum pad, a copper pad, or other metal pad.

19. The wafer of claim 14, wherein the first function block within the first layer comprises a sub-block connected to another sub-block in series or in parallel.

20. A wafer, comprising:
   a plurality of dies;
   a scribe line separating at least two of the plurality of dies; and
   a plurality of testing pads disposed in the scribe line, wherein a first path between a first pad and a second pad goes through a first function block in a first layer of a die on the wafer, and a second path between the first pad and the second pad goes through a second function block in a second layer of the die.

* * * * *